United States Patent
Izumi et al.

(10) Patent No.: US 6,828,805 B2
(45) Date of Patent: Dec. 7, 2004

(54) UNEVEN PATTERN SENSING DEVICE

(75) Inventors: Yoshihiro Izumi, Kashihara (JP); Osamu Teranuma, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 188 days.

(21) Appl. No.: 10/087,998

(22) Filed: Mar. 5, 2002

(65) Prior Publication Data

US 2002/0125437 A1 Sep. 12, 2002

(30) Foreign Application Priority Data

Mar. 7, 2001 (JP) ........................................ 2001-063983
Feb. 26, 2002 (JP) ........................................ 2002-050071

(51) Int. Cl.[7] .............................................. G01R 27/26
(52) U.S. Cl. ........................ 324/686; 324/663; 361/278; 382/124
(58) Field of Search ................................ 324/658–662, 324/686; 382/124; 361/278

(56) References Cited

U.S. PATENT DOCUMENTS 5,325,442 A 6/1994 Knapp ........................ 382/124
5,916,735 A * 6/1999 Nakashima et al. ........ 430/314
6,011,273 A * 1/2000 Ichikawa et al. ............. 257/57
6,234,031 B1 * 5/2001 Suga ..................... 73/862.474
6,248,655 B1 * 6/2001 Machida et al. ............ 438/597
6,411,726 B1 * 6/2002 Pires .......................... 382/124

FOREIGN PATENT DOCUMENTS

JP 2000-194825 A 7/2000

* cited by examiner

*Primary Examiner*—Vincent Q. Nguyen
(74) *Attorney, Agent, or Firm*—Nixon & Vanderhye P.C.

(57) ABSTRACT

What are formed on an insulating substrate are gate electrodes and data electrodes provided in a grid pattern, a TFT provided in each grid and connected to the gate electrode and the data electrode, an interlayer insulating film formed on the TFT and including a contact hole penetrating the film itself, and a sense electrode provided on the interlayer insulating film and passing through the contact hole. On the interlayer insulating film, an upper layer insulating film is formed so as to cover the sense electrode. A surface of the interlayer insulating film in which surface the sense electrode is formed is flat. On this account, it is possible to provide an uneven pattern sensing device capable of smoothing out a surface thereof without any increase of the manufacturing process and limitation of a choice of materials for a protective film.

26 Claims, 13 Drawing Sheets

UNEVEN PATTERN SENSING DEVICE

FIELD OF THE INVENTION

The present invention relates to an uneven pattern sensing device for sensing an uneven pattern such as fingerprints.

BACKGROUND OF THE INVENTION

Personal computers containing a fingerprint recognition system have been widely used in financial institutions and public offices such as the police, who often deal with highly confidential information. Meanwhile e-commerce such as stock transactions is becoming pervasive in accordance with increase of Internet users via mobile phones and development of IT industry, so that not only personal computers but also mobile phones and other mobile terminals etc. start to include the fingerprint recognition system therein.

Conventionally developed devices which include this kind of fingerprint recognition system are such as an optical fingerprint sensing device by which light and dark patterns formed by unevenness of a fingerprint is converted to charge information so as to be sensed and a capacitive fingerprint sensing device for electrically sensing a difference of capacitances formed by unevenness of a fingerprint.

Both of these two types of fingerprint sensing devices generally obtain two-dimensional distribution information of unevenness of a fingerprint by means of an active element array in which each pixel includes switching elements, by sensing charge information of each pixel.

The optical fingerprint sensing device requires a light source such as an LED and hence it is impossible to down-size a sensor as a whole including the fingerprint sensing device. Moreover, a structure of the fingerprint sensing device is complex since photo sensing elements such as a photo diode and a photo transistor have to be provided on the active element array.

In the meantime, the capacitive fingerprint sensing device is superior to the optical fingerprint sensing device in terms of the size, manufacturability, production cost and so forth. On this account, these days the capacitive fingerprint sensing device is more popular than the optical fingerprint sensing device.

What is shown in FIG. 12 as an example is a cross section of a capacitive fingerprint sensing device described in U.S. Pat. No. 5,325,442 (disclosed on Jun. 28, 1994). FIG. 13 also shows a plan of the same capacitive fingerprint sensing device. As can be seen in FIG. 12, in the fingerprint detection device, sense electrodes 103 arranged in a two-dimensional array (see FIG. 13) are provided on an interlayer insulating film 102 on a chip-shaped silicon (Si) substrate 101 on which a signal sense circuit (row drive circuit, sense circuit) etc. are formed, and a protective film 104 is provided so as to cover these sense electrodes 103. The fingerprint sensing device is manufactured using a standard CMOS process.

In the case of this type of CMOS fingerprint sensing device, i.e. the fingerprint sensing device including a MOS transistor formed on the Si substrate 101, a surface of the protective film 104 has differences in level in accordance with irregularity of heights between under the protective film 104 such as the interlayer insulating film 102, unillustrated metal wiring, electrical members like the sense electrodes 103 and so forth. On account of the differences, the protective film 104 is ripped so that the element becomes prone to degradation, when a finger touches a surface of a sensing part to obtain a fingerprint.

Although the interlayer insulating film 102 under the sense electrodes 103 seems flat in FIG. 12, this figure is a schematic view so that the Si substrate 101 is portrayed as flat for the sake of convenience. In reality the surface of the interlayer film 102 has certain differences in level (0.5 to 1.0 $\mu$m, for instance) in accordance with irregularity of heights between the MOS transistor and the metal wiring on the Si substrate 101.

Moreover, an $SiO_2$ thin film is generally used as an interlayer insulating film of the MOS transistor using an Si substrate. However, it is difficult to smooth out differences in level on the surface of the interlayer insulating film made of the $SiO_2$ thin film, since the shape of the film reflects that of underlying members.

Japanese Laid-Open Patent Application No. 2000-194825 (Tokukai 2000-194825; published on Jul. 14, 2000) discloses an arrangement of a fingerprint sensor capable of smoothing out a surface thereof using a protective film on sense electrodes. In this arrangement an $SiN_x$ film is adopted as the protective film to smooth out the surface of the protective film. As methods to smooth out the surface of the protective film, a method to etchback the surface after applying a resist thereon and a method to smooth out the surface using chemical mechanical polishing (CMP) are adopted. Alternatively it is possible to smooth out the surface of the protective film by applying a spin on glass (SOG) material as the surface protective film. By these methods it is possible to smooth out the surface so as to improve reliability of the fingerprint sensor.

However, the arrangement described in Japanese Laid-Open Patent Application No. 2000-194825 uses the $SiN_x$ film as the surface protective film so that the step to etchback the surface after applying the resist thereon or the CMP step are required. Thus the number of the manufacturing process is increased and the production yields are reduced, and hence the fingerprint sensor is manufactured at high cost.

An Si substrate is inherently expensive and hence manufacturing cost of the MOS transistor using an Si substrate tends to be high, thus cutting costs in manufacturing the same has been required. Especially this high manufacturing cost due to the increase of the manufacturing process becomes fatal flaw when one tries to mount the fingerprint detecting device on consumer-oriented cheep PDAs and mobile phones.

Also, a variety of materials available for the protective film is limited when the SOG material is adopted as the surface protective film. For instance, only a few types of SOG materials such as $SiO_2$ are generally obtainable. Therefore in this case, as the protective film it is impossible to adopt a wide variety of functional protective films using materials with added value such as a material having characteristics for improving the sensitivity of the fingerprint sensing device and a material with pollution resistance, other than the few types of films.

SUMMARY OF THE INVENTION

It is a main object of the present invention to provide an uneven pattern sensing device capable of smoothing out a surface thereof without any increase of a manufacturing process and limitation of a choice of materials for a protective film.

To solve the aforementioned problems, the uneven pattern sensing device in accordance with the present invention includes:

scanning lines and signal lines formed on a substrate in a grid pattern;

switching elements formed on the substrate in each grid and connected to the scanning lines and the signal lines;

an insulating film, formed on the substrate so as to cover the switching elements, having contact holes each of which is a perforation;

sense electrodes formed on the insulating film and connected to the switching elements via the contact holes; and a protective film formed on the insulating film so as to cover the sense electrode, wherein the insulating film has a flat area, which excludes a surface where each contact hole is provided, on which the sense electrode is provided.

According to this arrangement, the insulating film has a flat area, which excludes a surface where each contact hole is provided, on which the sense electrode is provided. This makes it also possible to form a flat protective film on the insulating film. Thus in the protective film it is unnecesary to conduct smoothing processes such as a process to etchback by applying a resist and a CMP process, so that a choice of materials for the protective film is not limited. Consequently, as the protective film it is possible to adopt a wide variety of functional protective films using materials with added value such as a material having characteristics for improving the sensitivity of the uneven pattern sensing device and a material with pollution resistance.

For a fuller understanding of the nature and advantages of the invention, reference should be made to the ensuing detailed description taken in conjunction with the accompanying drawings.

DESCRIPTION OF THE EMBODIMENTS

[Embodiment 1]

The following description will discuss an embodiment in accordance with the present invention in reference to FIGS. 1 to 8.

Figure 1:
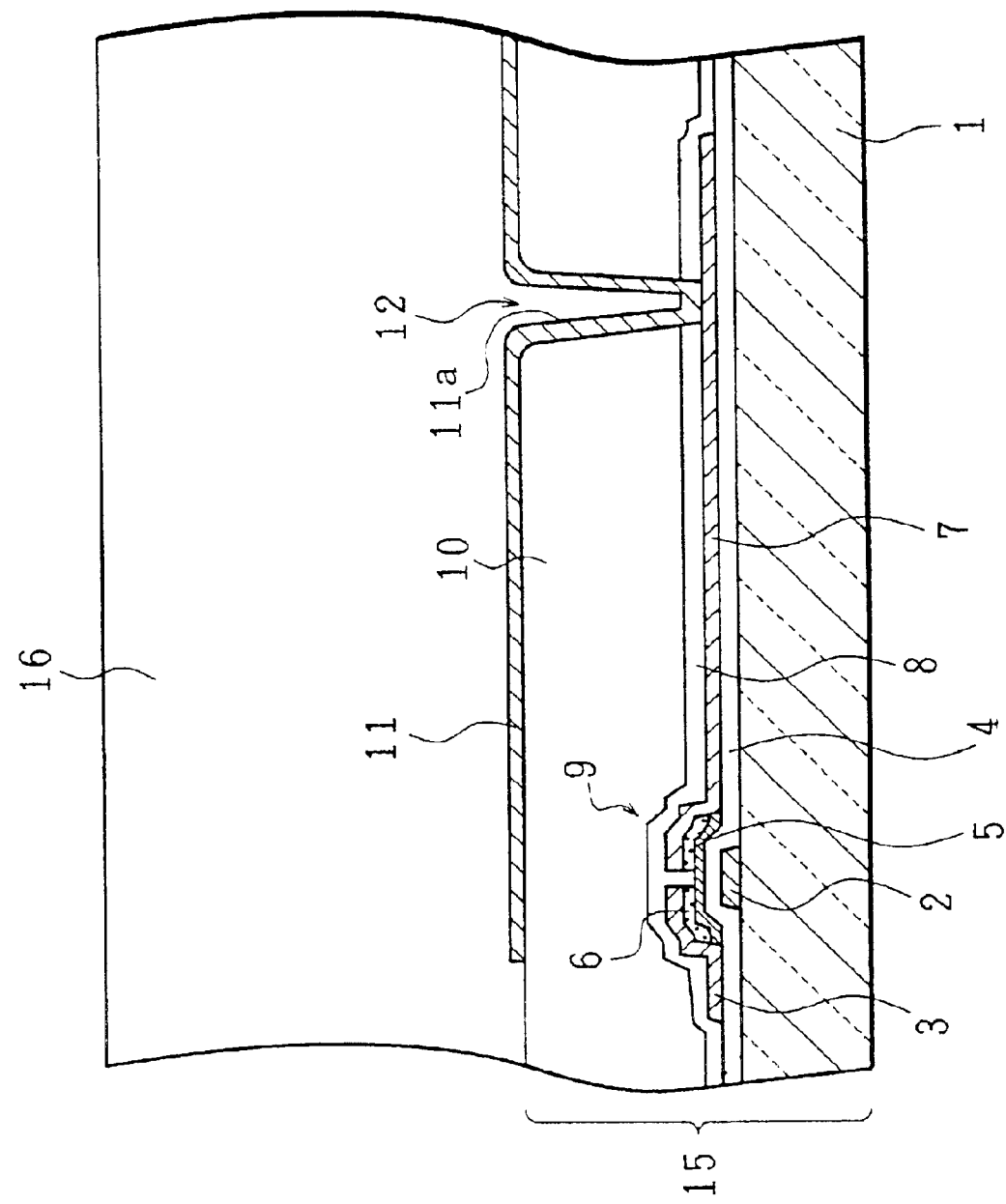
FIG. 1 is a cross section showing an arrangement of a main part of an uneven pattern sensing device in accordance with an embodiment of the present invention.

FIG. 1 is a cross section showing an arrangement of a main part of a fingerprint sensor as an uneven pattern sensing device in accordance with an embodiment of the present invention. Density of sensing pixels in an area of the fingerprint sensor which area is capable of sensing a fingerprint, i.e. an area on which sensing electrodes 11 to be described later are arranged in a two-dimensional manner (see FIG. 5, sensing pixel arrangement area 18), preferably falls in the range of 200 to 600 ppi, and the size of the sensing pixel arrangement area 18 preferably falls in the range of 10 mm×10 mm to 30 mm×30 mm.

Referring to FIG. 1, the uneven pattern sensing device includes an active matrix substrate 15 on which an upper layer insulating film 16 is formed as a protective film. The upper layer insulating film 16 may be an insulating film made of inorganic materials such as $SiN_x$ and $SiO_2$ or an insulating film made of organic materials such as an acrylic resin and a polyimide resin.

The following will describe the active matrix substrate 15 in detail.

The active matrix substrate 15 includes an insulating substrate (substrate) 1, gate electrodes 2, data electrodes 3, a gate insulating film 4, a channel layer 5, a contact layer 6, a connecting electrode 7, an insulating protective film 8, an interlayer insulating film (insulating film) 10, and a sense electrode 11.

Figure 2:
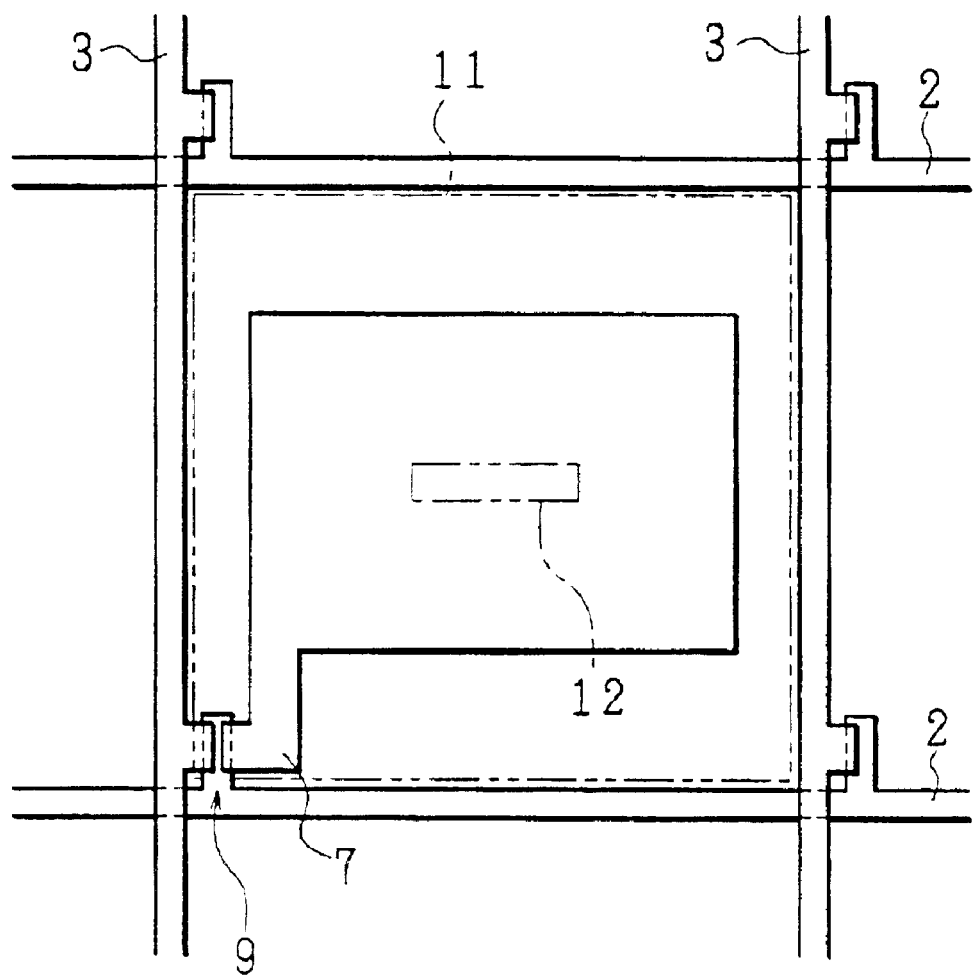
FIG. 2 is a plan showing the arrangement of the main part of the uneven pattern sensing device illustrated in FIG. 1.

As FIG. 2 indicates, this active matrix substrate 15 is arranged so that, on the insulating substrate 1, the sense electrode 11 is formed in a sensing pixel area surrounded by two data electrodes 3 and two gate electrodes 2 arranged in a grid manner, and the data electrodes 3 are signal lines while the gate electrodes 2 are scanning lines. Also a thin film transistor 9 (hereinafter, will be refer to as TFT) is formed near a point of intersection of the data electrode 3 and the gate electrode 2.

The TFT9 is made up of, as FIG. 1 indicates, the gate electrode 2, the gate insulating film 4, the data electrode 3, the connecting electrode 7, the channel layer 5, and the contact layer 6.

The insulating substrate 1 which is an insulating supporting substrate can be, for instance, a no-alkali glass substrate (for instance #1737 made by Corning Incorporated).

Source and drain of the TFT9 are respectively connected to the data electrode 3 and the connecting electrode 7, so the data electrode 3 is a source electrode of the TFT9 and the connecting electrode 7 is a drain electrode of the same. That is, the data electrode 3 is made up of a straight-line segment as the signal line and an extension segment (source electrode) for constituting the TFT9. The gate electrode 2 along with the data electrode 3 is electrode wiring containing a straight-line segment as a scanning line and an extension segment for constituting the TFT9. The gate electrode 2, the data electrode 3, and the connecting electrode 7 are made of conductive materials such as tantalum, aluminum, and ITO (Indium-Tin-Oxide).

The gate insulating film 4 is made of $SiN_x$, $SiO_x$ and so forth, and provided so as to cover the gate electrode 2. Incidentally, not only $SiN_x$ and $SiO_x$ but also an anodic oxide film, which is an anodized gate electrode 2, can be concurrently used as the gate insulating film 4.

The channel layer 5 (i layer) is a channel part of the TFT9, and an electric path connecting the data electrode 3 to the connecting electrode 7. In the contact layer 6 ($n^+$ layer) the data electrode 3 and the connecting electrode 7 contact each other. The channel layer 5 and the contact layer 6 are made up of amorphous silicon (hereinafter, will be referred to as a-Si) or polysilicon (hereinafter, will be referred to as p-Si).

The insulating protective film 8 made of $SiN_x$ is formed on the data electrode 3 and the connecting electrode 7, i.e. on almost entirety of the insulating substrate 1. On this account, the connecting electrode 7 and the data electrode 3 are protected as well as separated from each other so as to be electrically insulated. The insulating protective film 8 has a contact hole 12 in a predetermined part of the same, and through the hole 12 the connecting electrode 7 is exposed.

The sense electrode 11 is made of conductive materials such as ITO. The sense electrode 11 includes a connecting part 11a which is formed to cover the interior wall of the contact hole 12 and penetrate the interlayer insulating film 10 and the insulating protective film 8, and the sense electrode 11 is connected to the connecting electrode 7 via this connecting part 11a. The sense electrode 11 is deposited on the data electrode 3 and the connecting electrode 7 so as to cover the TFT9.

The interlayer insulating film 10 is made of organic matters such as an acrylic resin and a polyimide resin having photosensitivity, and electrically insulates the TFT9. The interlayer film 10 is penetrated by (has an opening of) the contact hole 12, and the sense electrode 11 is connected to the connecting electrode 7 through the hole 12.

The gate electrode 2 is provided on the insulating substrate 1. Above the gate electrode 2 the gate insulating film 4 is provided and then the channel layer 5 and the contact layer 6 are formed so as to be deposited in this order. Above the contact layer 6 the data electrode 3 and the connecting electrode 7 are formed, and above these two the insulating protective film 8 is provided.

Above the insulating protective film 8 the interlayer insulating film 10 is provided, and above the insulating film 10 the sense electrode 11 is provided as the top layer of the active matrix substrate 15. The sense electrode 11 is connected to the TFT9 via the connecting electrode 7.

As described above, the insulating substrate 1 of the fingerprint sensor is a glass substrate. A glass substrate is cheaper than a conventional Si substrate so that this makes it possible to provide a cheaper uneven pattern sensing device.

Not only a glass substrate but also a ceramic substrate and a plastic substrate can be used as the insulating substrate 1. Compared to the Si substrate, it is easy to manufacture a large substrate when one uses those substrates. On this account, it is possible to manufacture a lot of uneven pattern sensing devices from a single large substrate and hence it is possible to provide an inexpensive fingerprint sensor.

A plastic substrate is light and thin so that this makes it possible to achieve weight-reduction and down-sizing of the fingerprint sensor. Moreover, a plastic substrate has good cracking resistance and hence this makes it possible to provide a reliable fingerprint sensor.

Incidentally, not only the TFT9 but also a diode etc. such as an MIM can be used as a switching element.

Figure 3:
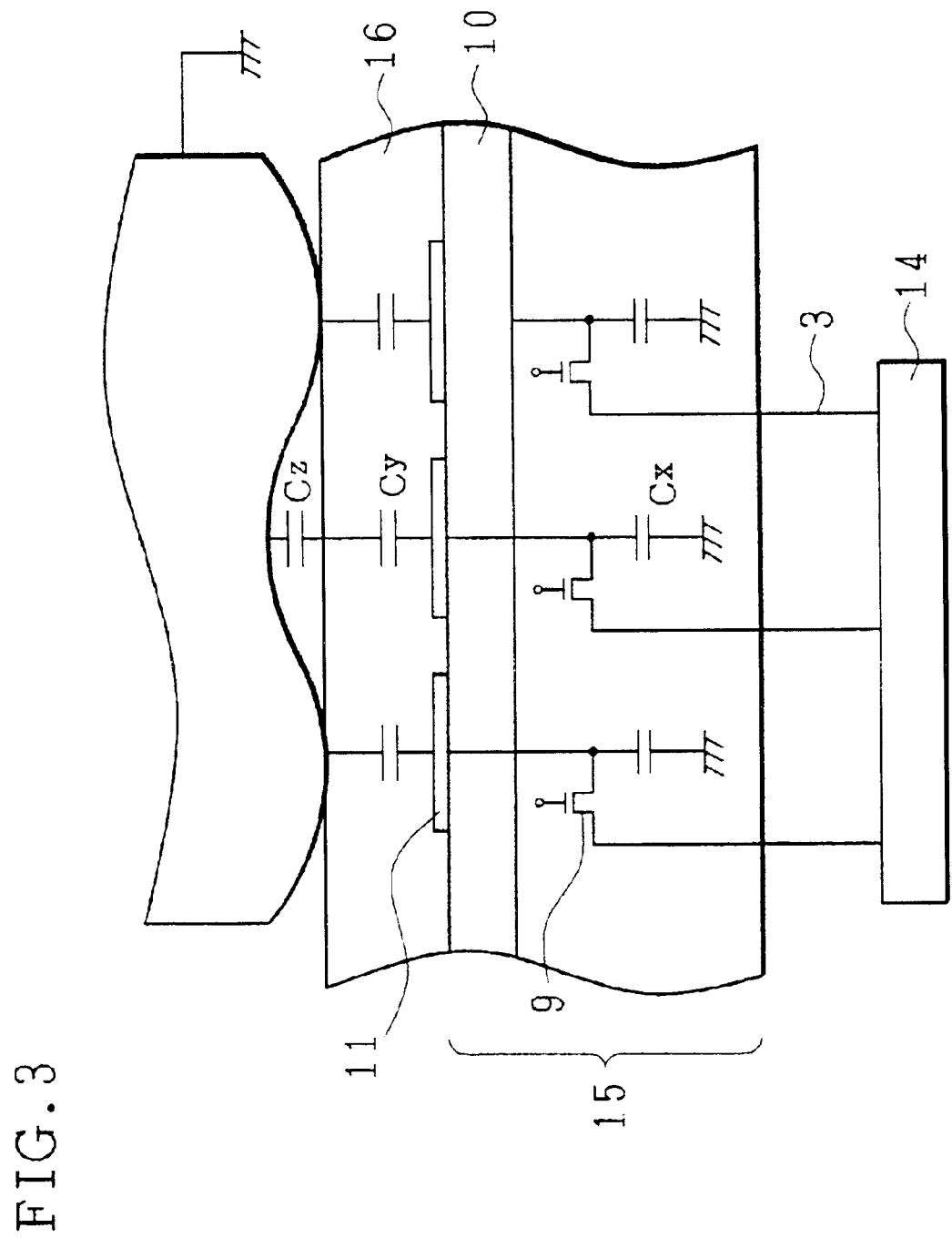
FIG. 3 describes a sensed capacitance value.

The following description will discuss operating principles of the fingerprint sensor in reference to FIG. 3.

When a surface of a finger touches a surface of the fingerprint sensor, what are formed between the finger and the sense electrode 11 are a capacity Cy of the upper layer insulating film 16 and a capacity Cz of air between the surface of the finger and the fingerprint sensor. The capacity Cy and the capacity Cz reflect information of unevenness on the finger so that it is possible to obtain a picture of the fingerprint by sensing these capacities Cy and Cz. Sensing the capacity Cz is done as follows.

First of all, the TFT9 is turned off using an input signal sent to a single gate electrode 2, and a parasitic capacity Cx formed in the sense electrode 11 and the connecting electrode 7 is pre-charged to a particular electrical potential.

Then the electric charge is shared among the capacities Cy and Cz by turning the TFT9 on using the input signal to the gate electrode 2. By sensing a change in an electrical potential of the data electrode 3 at this moment, the capacity Cz is determined.

The operation above is done in all gate electrodes 2 and distribution of the capacity Cz in a space between the finger and the fingerprint sensor, i.e. the picture of the fingerprint is obtained.

By the way, the data electrode 3 includes a signal sense circuit (sense circuit) such as an OP amp for sensing those capacities. This signal sense circuit can electrically sense capacity difference due to the unevenness of the fingerprint so that it is possible to describe the uneven pattern of the fingerprint as data.

In the capacities sensed by the fingerprint sensor, a ratio of signal components due to the unevenness of the fingerprint will be described with reference to FIG. 3. A capacitance value Cout sensed by the data electrode 3 at the moment of examining a fingerprint is expressed in following eq. (1).

$$Cout = Cx + CyCz/(Cy+Cz) \qquad (1)$$

The capacitance value Cout has a maximum value at $Cz \to \infty$ (the surface of the finger touches the upper layer insulating film 16), and the capacitance value Cout(max) in this case is expressed in following eq. (2).

$$Cout(max) = Cx + Cy \qquad (2)$$

In the meantime, the capacitance value Cout has a minimum value at $Cz \to 0$ (the surface of the finger is not above the upper layer insulating film 16), and the capacitance value Cout(min) in this case is expressed in following eq. (3).

$$Cout(min) = Cx \qquad (3)$$

Thus in the capacitance values sensed by the fingerprint sensor, the ratio of signal components due to the unevenness of the fingerprint is expressed in following eq. (4).

$$(Cout(max) - Cout(min))/Cout(max) = Cy/(Cx+Cy) \qquad (4)$$

That is, the greater the ratio of Cy to (Cx+Cy) is, the higher the sensitivity of the fingerprint sensor is. Thus to obtain a highly sensitive fingerprint sensor, the device should be designed to have a minimum parasitic capacity Cx formed in the sense electrode 11 and the connecting electrode 7 and a maximum capacity Cy of the upper layer insulating film 16.

In the arrangement illustrated in FIG. 1, the TFT9 is rarely overlapped with the connecting electrode 7 and the sense electrode 11, and the parasitic capacity Cx formed in the sense electrode 11 and the connecting electrode 7 is small enough compared to the capacity Cy of the upper layer insulating film 16, so that it is possible to provide a highly sensitive fingerprint sensor.

The following description will discuss an example of a manufacturing process of the uneven pattern sensing device.

First, the gate electrode 2 is formed on the insulating substrate 1 by forming a conductive film made of tantalum, aluminum, ITO and so forth having a thickness of 100 to 300 nm by means of sputter deposition and then patterning the same in a desired form.

Then over the gate electrode 2, the gate insulating film 4, which is made of $SiN_x$, $SiO_x$, etc. and has a thickness around 200 nm, is formed on a substantially entire surface of the insulating substrate 1 by a CVD (Chemical Vapor Deposition) method.

Also the channel layer 5 is formed by forming a film having a thickness around 100 nm made of a-Si by the CVD method and then patterning the same in a desired form, so that the channel layer 5 is provided above the gate electrode 2 via the gate insulating film 4.

The contact layer 6 is formed by forming a film made of a-Si having a thickness around 40 nm by the CVD method and then patterning the same in a desired shape, so that the contact layer 6 is deposited on the channel layer 5.

Then over the contact layer 6, the data electrode 3 and the connecting electrode 7 are formed by forming a conductive film made of tantalum, aluminum, ITO and so forth having a thickness around 200 nm by means of sputter deposition and then patterning the same in desired forms.

Then the insulating protective film 8 is formed by forming an $SiN_x$ film which has a thickness around 200 nm and covers a substantially entire surface of the insulating substrate 1 on which the TFT9 is formed as above, by the use of the CVD method, and then removing the $SiN_x$ film formed above a predetermined area of the connecting electrode 7, which is the area to be the contact hole 12.

To cover a substantially entire surface of the insulating protective film 8 to a thickness of around 3 $\mu$m, the interlayer insulating film 10 is formed by applying a photosensitive acrylate resin etc. by the use of a painting tool such as a spinner. Then:

an area of the insulating protective film 8 which area is supposed to become the contact hole 12; and an area of the interlayer insulating film 10 on which area an opening of the contact hole 12 is supposed to be formed when the hole 12 penetrates the film 10 are aligned, using a photomask having a predetermined shading pattern, so that the interlayer insulating film 10 is subjected to a photolithographic treatment, and the contact hole 12 penetrating the interlayer insulating film 10 is formed.

Then on the interlayer insulating film 10, the sense electrode 11 is formed by forming a conductive film made of ITO and so forth having a thickness around 100 nm by means of sputter deposition and then patterning the same in a desired form. In this process the sense electrode 11 is provided through the contact hole 12 penetrating the insulating protective film 8 and the interlayer insulating film 10, to make the sense electrode 11 electrically contact with the connecting electrode 7.

To cover a substantially entire surface of the active matrix substrate 15 which is arranged as above, the upper layer insulating film 16 made of $Ta_2O_5$ is formed with a thickness of 0.2 to 5 $\mu$m. Then on the insulating substrate 1, a drive circuit 13 and a sense circuit 14 (see FIG. 5) to be described later are mounted.

It is possible to form the contact hole 12 with ease by the photolithographic treatment, since the interlayer insulating film 10 has photosensitivity. The interlayer insulating film 10 is an organic film made of organic matters such as an acrylic resin, and formed by the use of a painting tool such as a spinner.

On this account it is possible to form the interlayer insulating film 10 having a smooth and flat surface. That is to say, after the interlayer insulating film 10 is formed it is unnecesary to add a process to smooth out differences in level on the surface of the film 10, which differences reflect irregularity of heights between the members under the film 10, such as the TFT9, the data electrode 3, the gate electrode 2 and so forth. Namely, for instance, a process to etchback by applying a resist or a CMP (Chemical Mechanical Polishing) process is unnecessary.

Moreover, since the surface of the interlayer insulating film 10 on the side of sensing pixels (the side to contact with a fingerprint) is flat, the shape of the surface of the top layer, i.e. that of the upper layer insulating film 16 is influenced only by the thickness of the sense electrode 11 on the interlayer insulating film 10 and the depression of the contact hole 12.

The thickness of the sense electrode 11 is only around 100 nm and also the same is covered with the upper layer insulating film 16 so that a taper of the surface difference of the film 16 on account of the thickness of the sense electrode 11 is gentle. Thus the surface difference of the film 16 on account of the thickness of the sense electrode 11 is small enough to be ignored.

In this case the surface difference less than 0.5 $\mu$m is considered to be negligible.

Meanwhile the depth of the surface difference due to the contact hole 12 is equal to the thickness of the interlayer insulating film 10, i.e. 1 to 5 $\mu$m, so as not to be negligible.

The following description will discuss the depressions on the surface in reference to FIGS. 4(a) and 4(b). FIG. 4(a) illustrates a case when a microscopic protrusion exists on the surface while FIG. 4(b) illustrates a case when a microscopic depression exists thereon.

As illustrated in FIG. 4(a), provided that a friction object such as a finger moves on a surface with microscopic protrusion, the friction object is likely to move jerkily even if the protrusion is microscopic, especially when the height of the protrusion is 0.5 $\mu$m or higher. So the protrusion is apt to be destroyed. Incidentally an experiment has proven that this does not always hold true for a protrusion lower than 0.5 $\mu$m.

Figure 4:
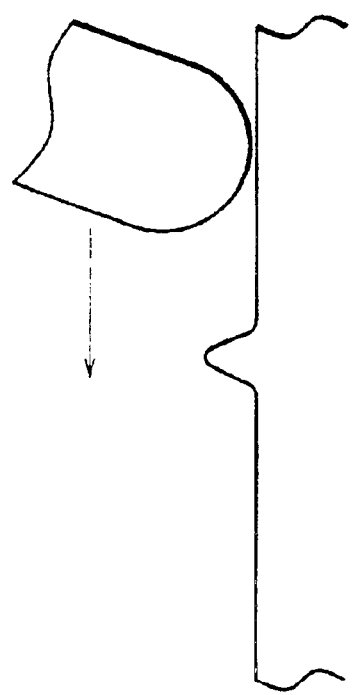
FIG. 4(a) describes effect of a protrusion on a friction object, while FIG. 4(b) describes effect of a depression on a friction object.
Figure 4:
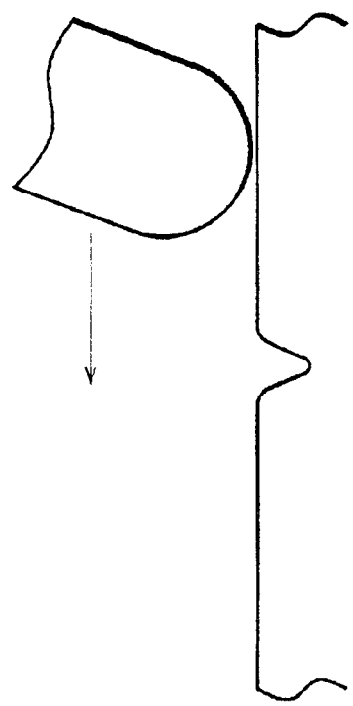

In the meantime, as indicated in FIG. 4 (b), provided that a friction object such as a finger moves on a surface with a microscopic depression, the friction object is unlikely to move jerkily so that the depression is unlikely to be destroyed, if the depression on the surface is microscopic compared to the friction object.

In this manner the surface difference generated due to the depression of the contact hole 12 is 1 to 5 $\mu$m so as not to be negligible, however, the shape thereof is concave in this case. The depression on the surface is microscopic compared to a fingerprint pattern to be sensed so that the surface difference generated due to the depression of the contact hole 12 is negligible.

Thus it is unnecessary to include the process to smooth out the surface difference of the upper layer insulating film 16, such as the process to etchback by applying a resist and the CMP process.

So the interlayer insulating film 10 does not require to be smoothed out since a top surface thereof (a surface on which the sense electrodes 11 are formed except an area constituting the contact hole 12, i.e. a surface substantially faces the insulating substrate 1) is formed to be flat. Moreover, it is possible to form the upper layer insulating film 16 to be substantially flat since the top surface of the interlayer insulating film 10 is flat so that the upper layer insulating film 16 does not require to be smoothed out. On this account, it is possible to simplify the manufacturing process of the fingerprint sensor.

Also, smoothing processes such as the process to etchback by applying a resist and the CMP process are unnecessary and hence a choice of the material of the upper layer insulating film 16 is not limited to any particular material. Thus as the upper layer insulating film 16, it is possible to adopt a wide variety of functional protective films using materials with added value such as a material having characteristics for improving the sensitivity of the fingerprint sensor and a material with pollution resistance.

Now, a case when $Ta_2O_5$ is adopted as the material of the upper layer insulating film 16 and a case when conventional $SiN_x$ is adopted as the material thereof are compared with. A relative permittivity of $Ta_2O_5$ is around 24 whereas that of $SiN_x$ is around 7.5. The capacity Cy of the upper layer insulating film 16 is proportional to the relative permittivity of itself. Thus the capacity Cy when a film made of $Ta_2O_5$ is adopted as the upper layer insulating film 16 is 3.2 times greater than the capacity Cy when a film made of $SiN_x$ is adopted. On this account it is possible to provide a highly sensitive fingerprint sensor.

By the way the material of the upper layer insulating film 16 is not particularly limited to $Ta_2O_5$ which is an oxide of tantalum. For instance, it is possible to adopt a material such as $SiN_x$, capable of forming an amorphus high-dielectric film which is obtained through a low-temperature sputtering at not more than 200° C. and has a relative permittivity of not less than 5. More preferably it is possible to adopt materials such as $TiO_2$, $SrTiO_3$, $BaTiO_3$, and $Ba_xSr_{1-x}TO_3$, capable of forming an amorphus high-dielectric film which is obtained through the low-temperature sputtering at not more than 200° C. and has a relative permittivity of not less than 10. On this account the sensitivity of the fingerprint sensor can be improved easily.

If an SOG (Spin On Glass) is adopted as the material of the upper layer insulating film 16 as conventionally done, a choice of the materials is limited. However, in this embodiment it is possible to smooth out the upper layer insulating film 16 without using the SOG, and hence various materials such as the ones described above can be adopted as the upper layer insulating film 16.

Moreover, for instance, it is possible to adopt a fluororesin film as the upper insulating film 16. The fluororesin film can be formed by lamination (dry transferring method) as well as application of the resin. As an example, a process to form the upper layer insulating 16 made of fluororesin by the lamination of the resin is described with reference to FIGS. 7(a) to 7(d).

First of all, a fluororesin sheet 71 which is 2 to 5 μm thick is formed on a supporting film 70 such as a PET (polyethylene terephthalate) sheet (FIG. 7(a)). Then an adhesive layer around 1 μm thick is applied on the surface of the fluororesin sheet 71.

Figure 7:
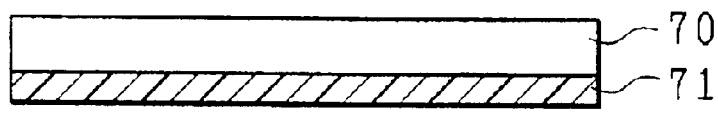
FIGS. 7(a) to 7(d) are flow charts showing a process to form an upper layer insulating film.
Figure 7:
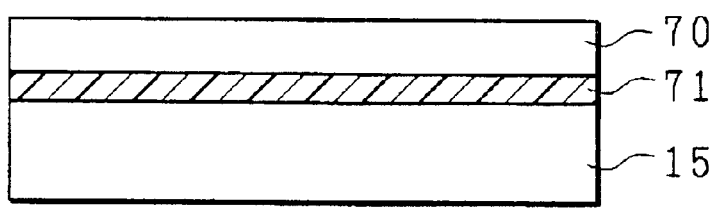
Figure 7:
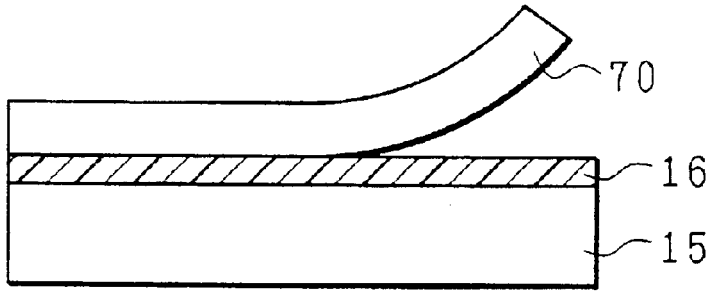
Figure 7:
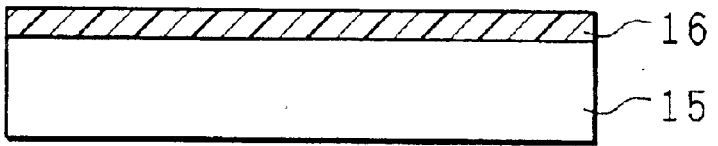

Then the surface of the fluororesin sheet 71 on which the adhesive layer is applied and a part of the surface of the active matrix substrate 15 where the sense electrode 11 is exposed are thermo-laminated to contact with each other (FIG. 7(b)). Then by peeling off (FIG. 7 (c)) and removing (FIG. 7 (d)) the supporting film 70, the upper layer insulating film 16 is formed on the active matrix substrate 15.

The fluororesin film is used as the upper layer insulating film 16 so that the surface of the fingerprint sensor is made of the fluororesin. On this account it is possible to improve a pollution resistance of the surface of the fingerprint sensor and also reliability of the sensor is improved.

Incidentally, material of the upper layer insulating film 16 is not limited to the fluororesin so that it is possible to adopt water repellent resin materials such as a silicone resin.

Moreover, the upper layer insulating film 16 is not necessarily a single layer film made of the fluororesin so that other insulating materials such as $SiN_x$ and $SiO_x$ may be laminated along with the fluororesin as a multilayer.

As described above, the surface of the interlayer insulating film 10 on the side of sensing pixels is flat so that it is unnecesary to smooth out the upper layer insulating film 16. Thus in the upper layer insulating film 16, it is no longer necessary to include the process to etchback by applying a resist and a smoothing process such as the CMP, and hence a choice of the materials of the upper layer insulating film 16 is not restricted to any particular materials. On this account, it is possible to smooth out the surface of the fingerprint sensor without increasing the number of the manufacturing process.

By the way, it is possible to adopt this kind of upper layer insulating film 16 for a fingerprint sensor formed through a conventionally used CMOS process.

Moreover, although the TFT9 using a-Si as the switching element is used here, p-Si (polysilicon) may be employed as the same. Although a reverse stagger structure, in which the data electrode 3 and connecting electrode 7 are provided above the gate electrode 2 via the gate insulating film 4, is adopted in the present embodiment, a stagger structure may be adopted. Although the active matrix substrate 15 adopts a so-called roof structure (mushroom electrode structure) in which the sense electrode 11 stretches over the TFT9, the substrate 15 is not necessarily structured as such.

The interlayer insulating film 10 is formed using a photosensitive resin so that the film forming process and patterning process are simplified. However, a non-photosensitive resin such as, for instance, a non-photosensitive polyimide resin and a BCB (benzocyclobutene) resin may be adopted as long as the contact hole 12 can be formed by etching.

The thickness of the interlayer insulating film 10 is preferably not less than 1 μm and not more than 5 μm. By adjusting the thickness of the interlayer insulating film 10 not less than 1 μm i.e. thicker than the TFT9, the gate electrode 2, and the data electrode 3 that are provided under the film 10, and also forming the film by application of an insulating material, it is possible to eliminate the difference on the surface of the interlayer insulating film 10 and smooth out the surface. Also, by adjusting the thickness of the interlayer insulating film 10 not more than 5 μm, it is possible to apply a resin uniformly on a large substrate having an area around 300 mm×300 mm to 1000 mm×1000 mm, and form the interlayer insulating film 10. On this account, it is possible to manufacture a lot of uneven pattern sensing devices from a large substrate without lowering reliability of the elements.

Figure 5:
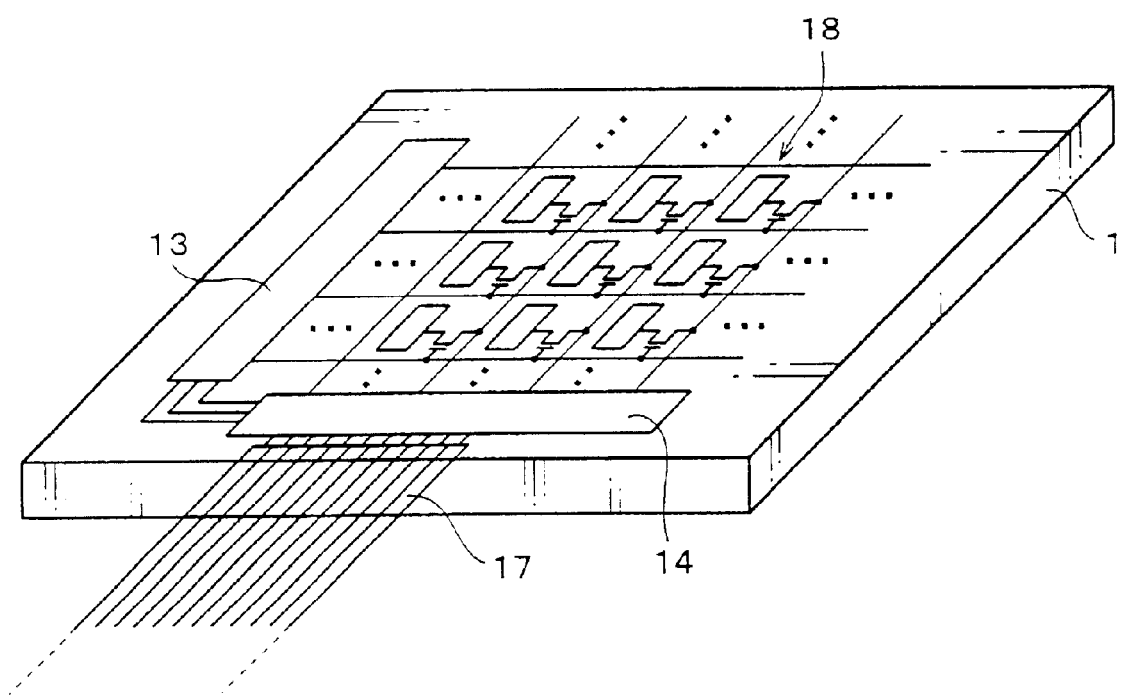
FIG. 5 is a perspective view showing an arrangement of the uneven pattern sensing device illustrated in FIG. 1 when a drive circuit and a sense circuit are monolithically formed on an insulating substrate of the device.

To operate the fingerprint sensor, as shown in FIG. 5, it is necessary to provide the drive circuit 13 for applying a driving signal to the gate electrode 2 and the sense circuit 14 (amplifying circuit, for instance) for sensing a signal from the data electrode 3. When the insulating substrate 1 is a glass substrate and the TFT9 is made of a-Si, it is not possible to form the drive circuit 13 and sense circuit 14 monolithically on the insulating substrate 1, so that it is necessary to additionally mount a drive circuit LSI and sense circuit LSI thereon.

In this case it is possible to mount the drive circuit LSI and sense circuit LSI on the periphery of the insulating substrate 1 by adopting a TAB (Tape Automated Bonding) mounting method in which the LSI is mounted on a career tape and then connected to the substrate 1 or a COG (Chip On Glass) mounting method in which the LSI is directly mounted on the insulating substrate 1. Among these two the COG mounting method is preferable since the same makes it possible to simplify the manufacturing process and the connection with surrounding circuits.

Incidentally, even though the insulating substrate 1 is a glass substrate, when the TFT9 is made of p-Si or continuous grain boundary silicon (CG-Si), as FIG. 5 shows, it is possible to form the drive circuit 13 and sense circuit 14 directly and monolithically on the insulating substrate 1, i.e. in the same process as forming the TFT9, if the drive circuit 13 and sense circuit 14 are also made of p-Si or CG-Si. This is because a p-Si film and CG-Si film have better electron mobility than the a-Si film and also the former films can be formed at a lower process temperature which is not more than 600° C. In this case signals are transmitted through a FPC (Flexible Printed Circuit) 17.

On this ground, it is unnecessary to additionally provide the drive circuit LSI and sense circuit LSI so that the manufacturing cost can be reduced and the mounting process can be simplified. Also it is possible to provide the drive circuit 13 and sense circuit 14 in a small area of the peripheral part of the sensing pixel arrangement area 18 on the insulating substrate 1. Thus it is possible to provide the insulating substrate 1 having a frame narrower than that of the insulating substrate 1 to which the drive circuit LSI and sense circuit LSI are connected by the TAB or COG mounting method, and hence the fingerprint sensor can be downsized.

Figure 6:
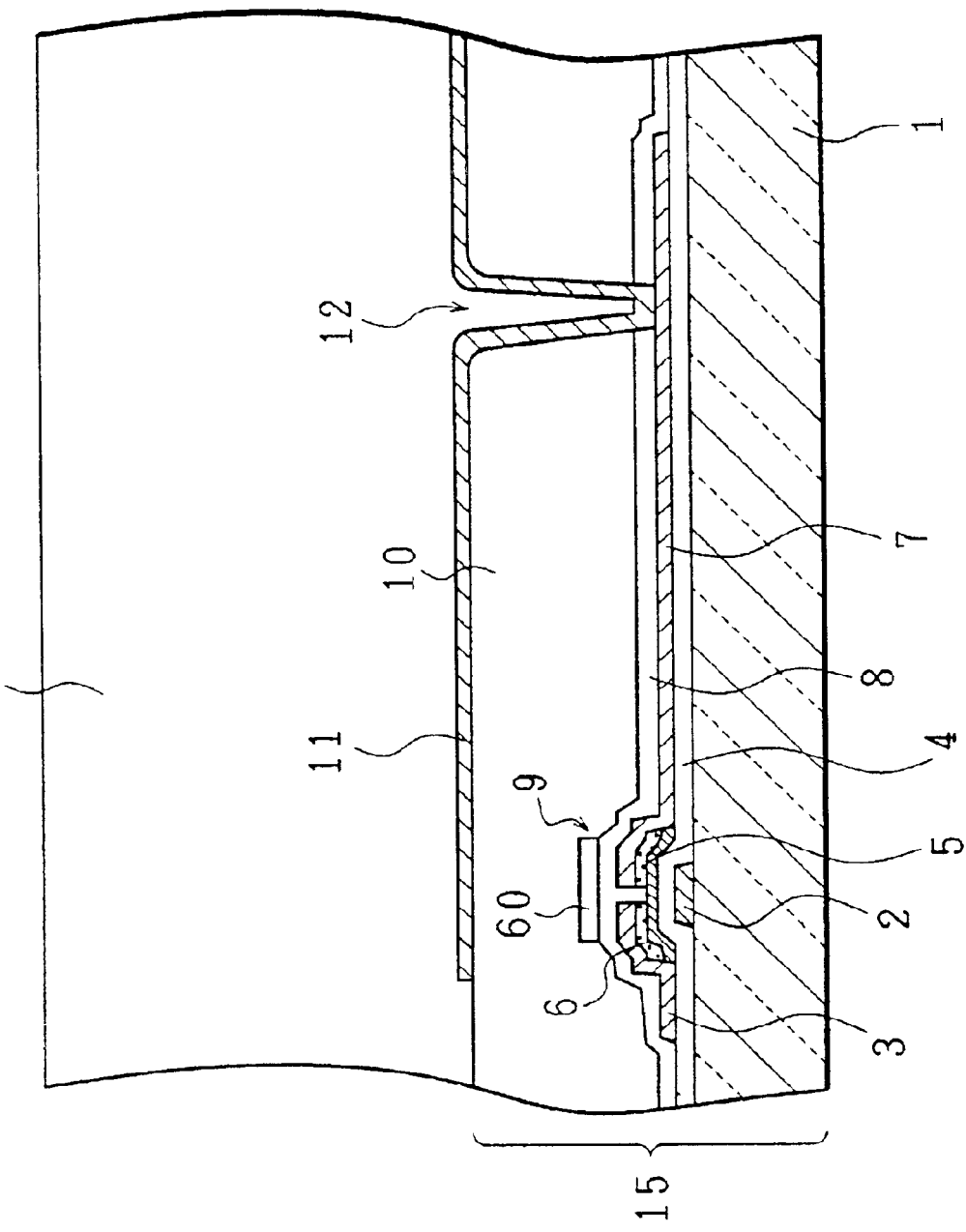
FIG. 6 is a cross section showing an arrangement of the uneven pattern sensing device illustrated in FIG. 1 when a shade film is added to the device.

As illustrated in FIG. 6, a shade film 60 may be provided on the TFT9. This shade film 60 is made up of metals and black resin materials. The shade film 60 is provided on the TFT9 so that it is possible to prevent incidence of external light from the top surface of the fingerprint sensor to the TFT9. Thus it is possible to prevent malfunction of the TFT9 caused by the incident light.

If the shade film 60 is not provided, especially in the case when the TFT9 employs the reverse stagger structure, an unnecessary carrier is generated in the channel layer 5 at the moment of the incidence of light into the channel layer 5, and ON/OFF characteristics thereof is degraded. However, providing the shade film 60 on the TFT 9 prevents the degradation of the ON/OFF characteristics. In this manner providing the shade film 60 reduces an influence of external light and thus it is possible to prevent the malfunction of the TFT9 and the degradation of the ON/OFF characteristics thereof.

Moreover, the interlayer insulating film 10 may be made up of a resin with a shading property. The resin with a shading property preferably includes carbon black dispersed therein. On this account it is possible to provide the interlayer insulating film 10 which is insulating and has a shading property so as to reduce the influence of external light, and hence it is possible to prevent the malfunction of the TFT9 and the degradation of the ON/OFF characteristics thereof.

Furthermore, the sense electrode 11 may have a shading property due to the use of metals such as aluminum and molybdenum as the material. On this account it is possible to reduce the influence of the external light, and hence it is possible to prevent the malfunction of the TFT9 and the degradation of the ON/OFF characteristics thereof. Also it is unnecessary to additionally provide the shade film 60 so that the structure of the fingerprint sensor can be simplified.

Figure 8:
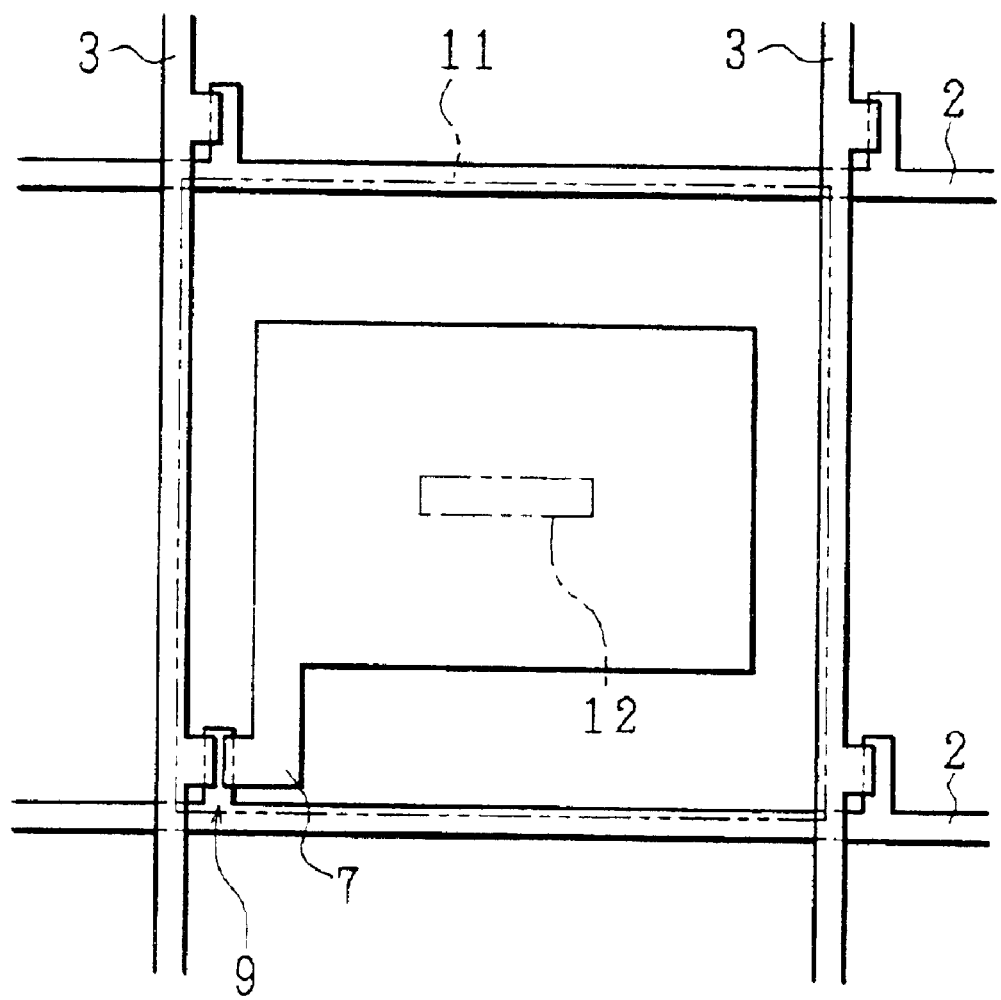
FIG. 8 is a plan showing an arrangement of the uneven pattern sensing device illustrated in FIG. 1 when a sense electrode is provided so as to cover parts of data electrodes and gate electrodes.

The sense electrode 11 may be provided to be overlapped with at least either the data electrodes 3 as signal lines or the gate electrodes 2 as scanning lines. FIG. 8 shows an example in which the sense electrode 11 is provided to be overlapped with a part of the data electrodes 3 and a part of the gate electrodes 2.

The sense electrode 11 in this case is larger than the sense electrode 11 provided not to be overlapped with either the data electrodes 3 nor the gate electrodes 2, as shown in FIG. 2. When the sense electrode 11 is provided not to be overlapped with either the data electrodes 3 nor the gate electrodes 2, the sense electrode 11 occupies around 70% of one sensing pixel (hereinafter, this will be referred to as fill factor of the sense electrode 11). In the meantime, when the sense electrode 11 is provided to be overlapped with a part of the data electrodes 3 and a part of the gate electrodes 2, the fill factor of the sense electrode 11 is increased to be not less than 80%.

Thus it is possible to increase the capacity Cy of the upper layer insulating film 16 and hence improve reliability of the fingerprint sensor.

Moreover, the sense electrode 11 may be provided to be overlapped with the TFT9. In this case the fill factor of the sense electrode 11 can be further improved so that it is possible to provide a further sensitized fingerprint sensor. Also in this case the sense electrode 11 acts as an electric shield of the TFT9 provided below the electrode 11, and hence it is possible to prevent malfunction of the TFT9.

[Embodiment 2]

Figure 9:
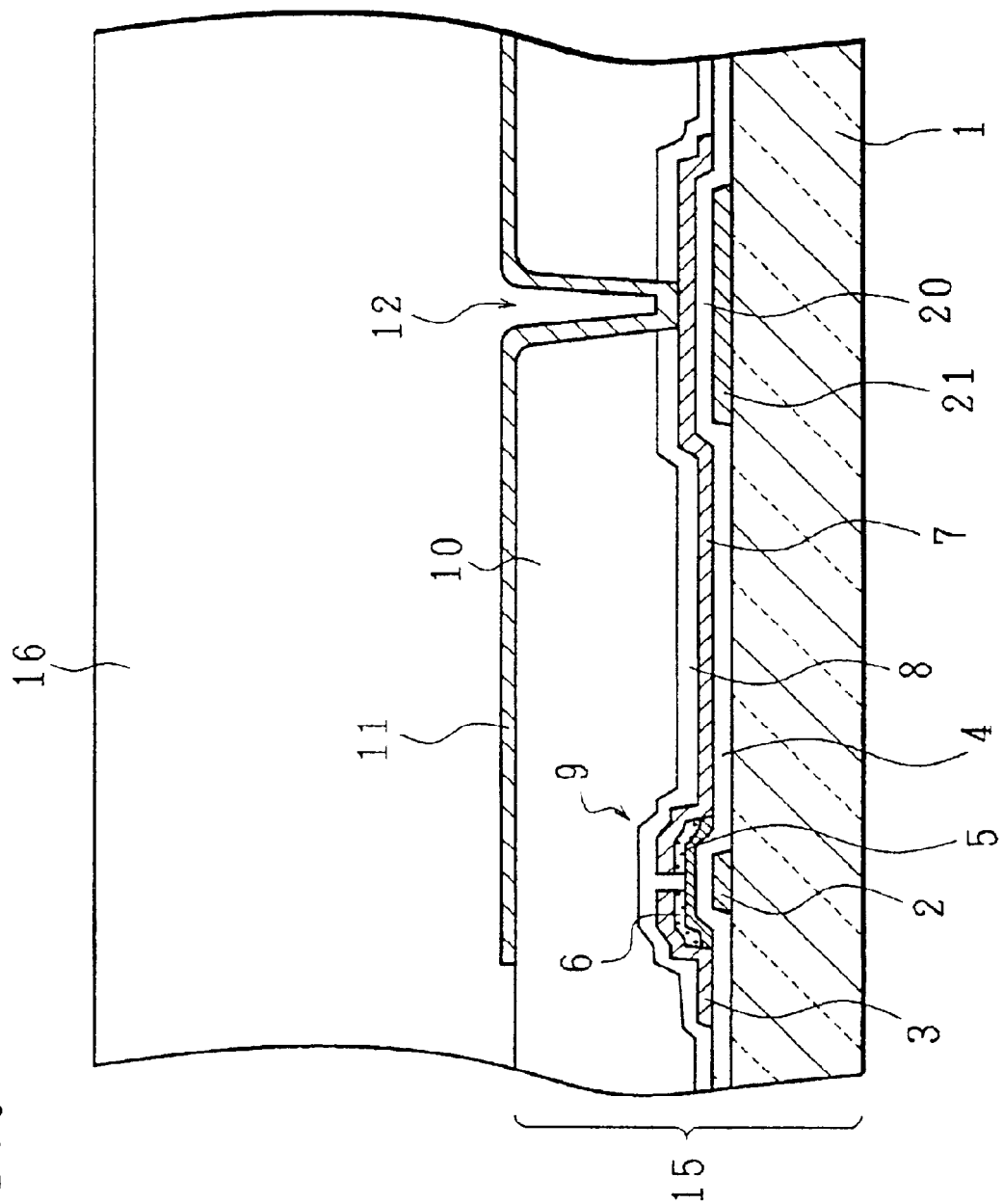
FIG. 9 is a cross section showing another arrangement of a main part of an uneven pattern sensing device in accordance with an embodiment of the present invention.
Figure 10:
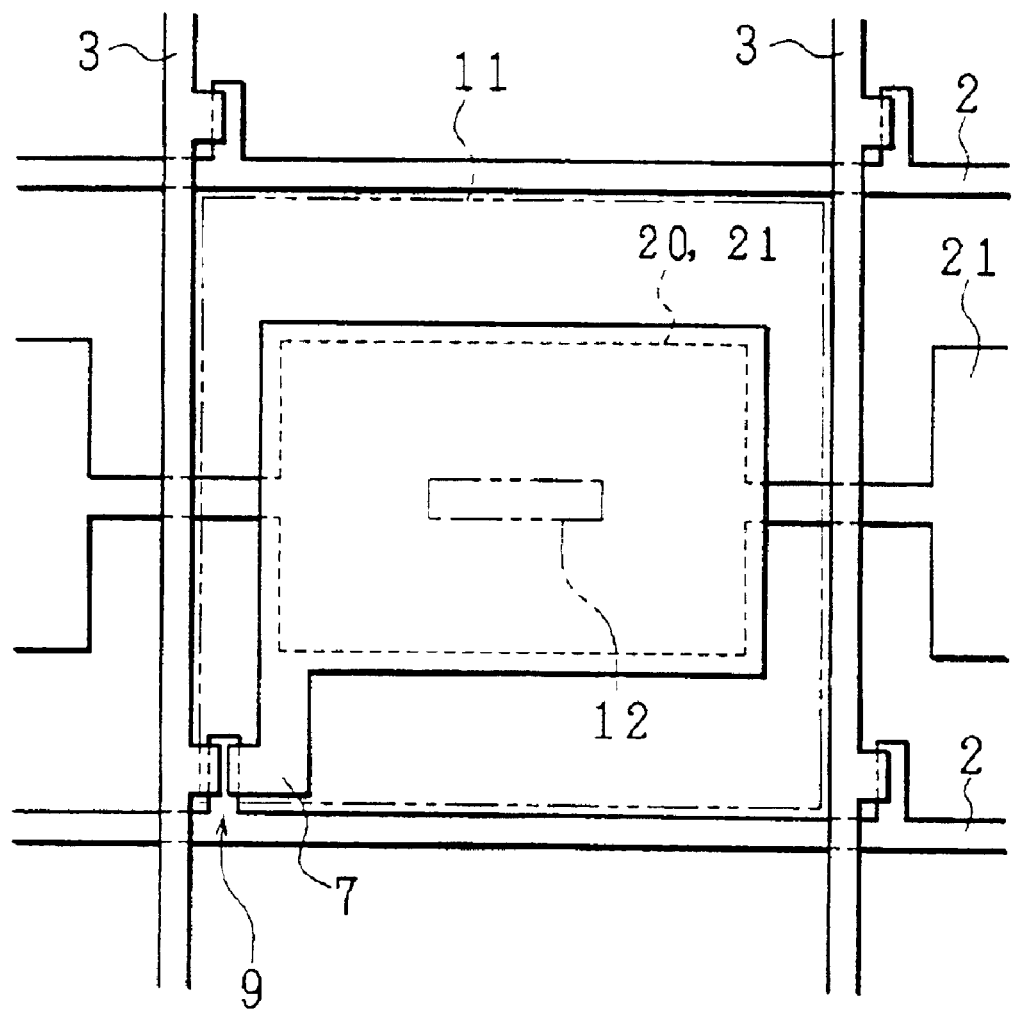
FIG. 10 is a plan showing the arrangement of the main part of the uneven pattern sensing device illustrated in FIG. 9.
Figure 11:
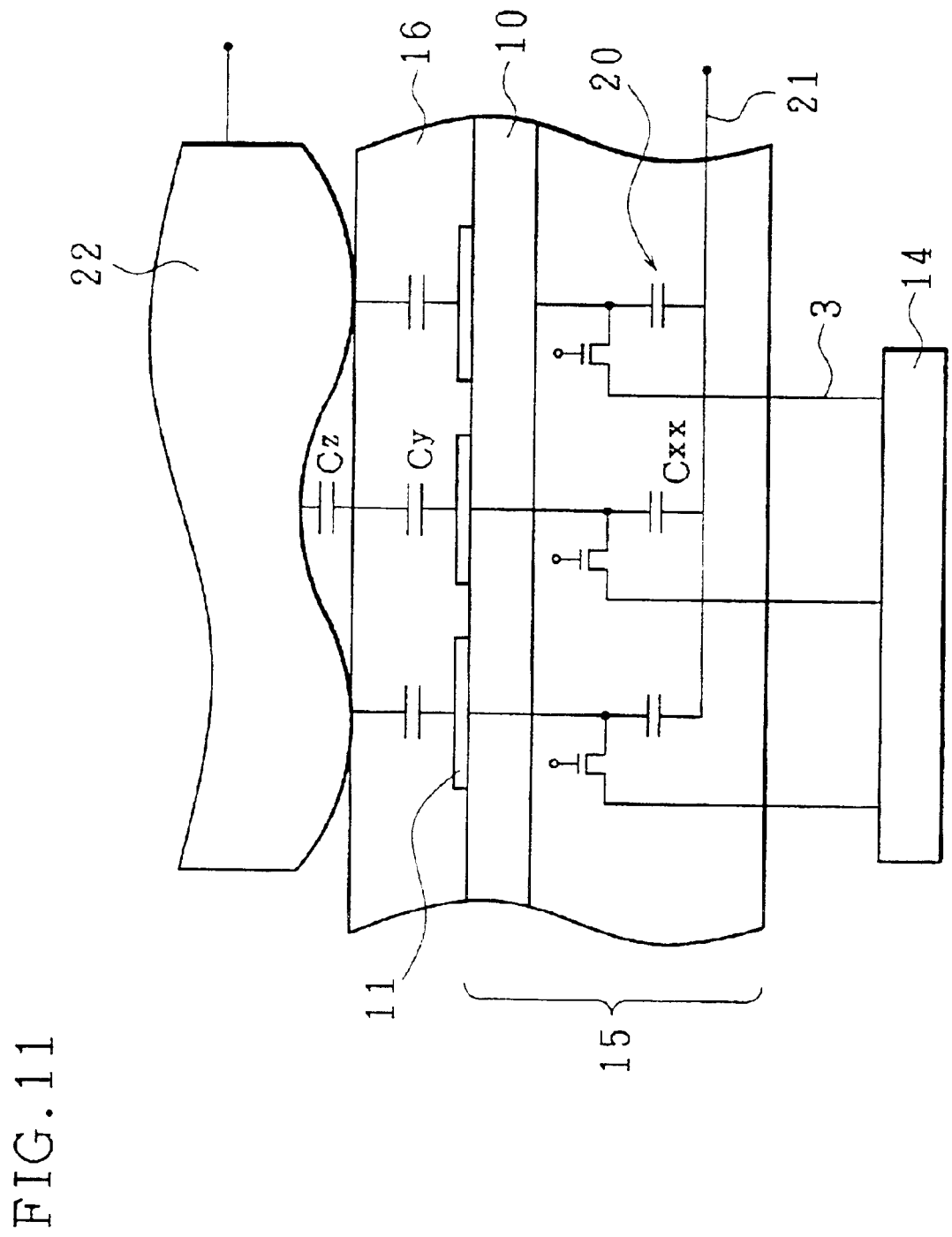
FIG. 11 describes a sensed capacitance value.
Figure 12:
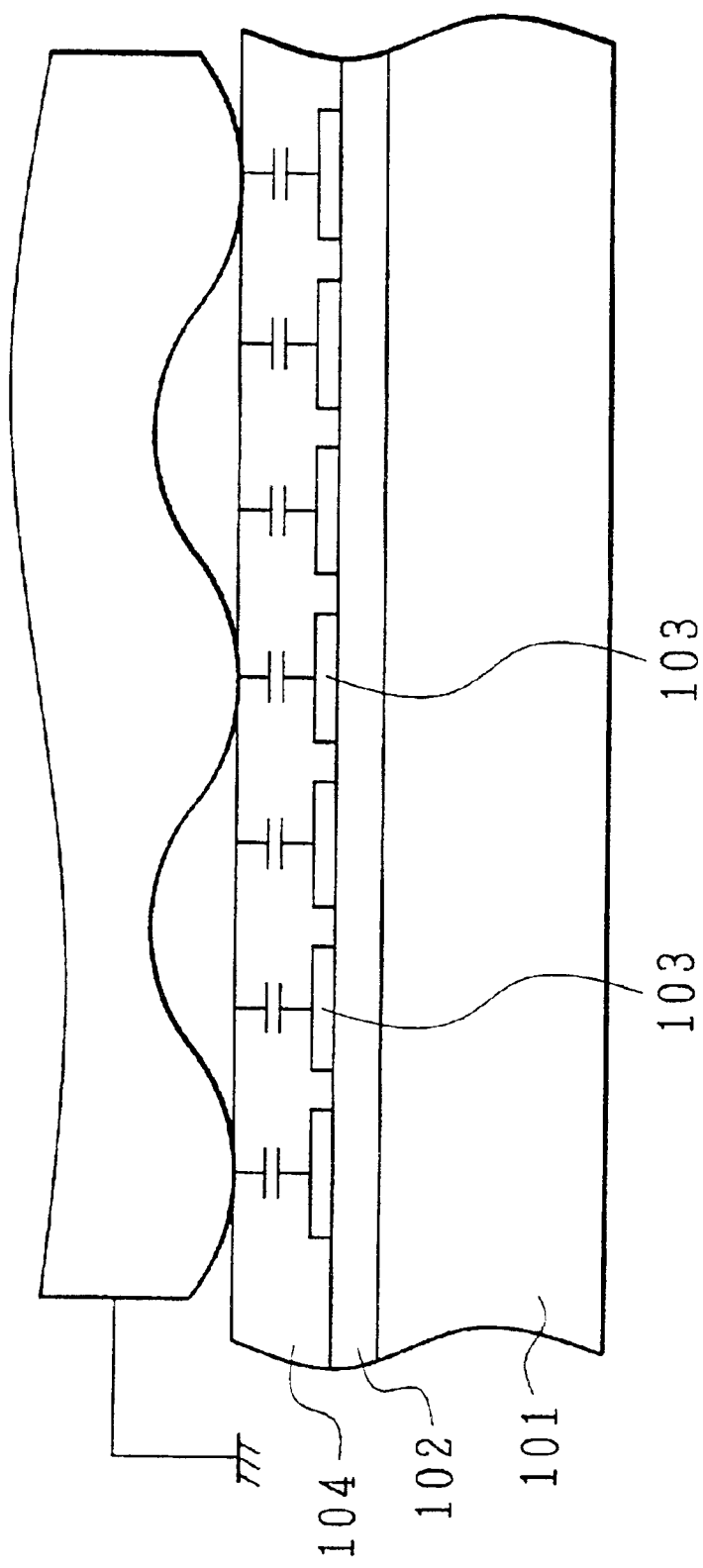
FIG. 12 is a cross section showing an arrangement of a main part of a conventional fingerprint sensor.
Figure 13:
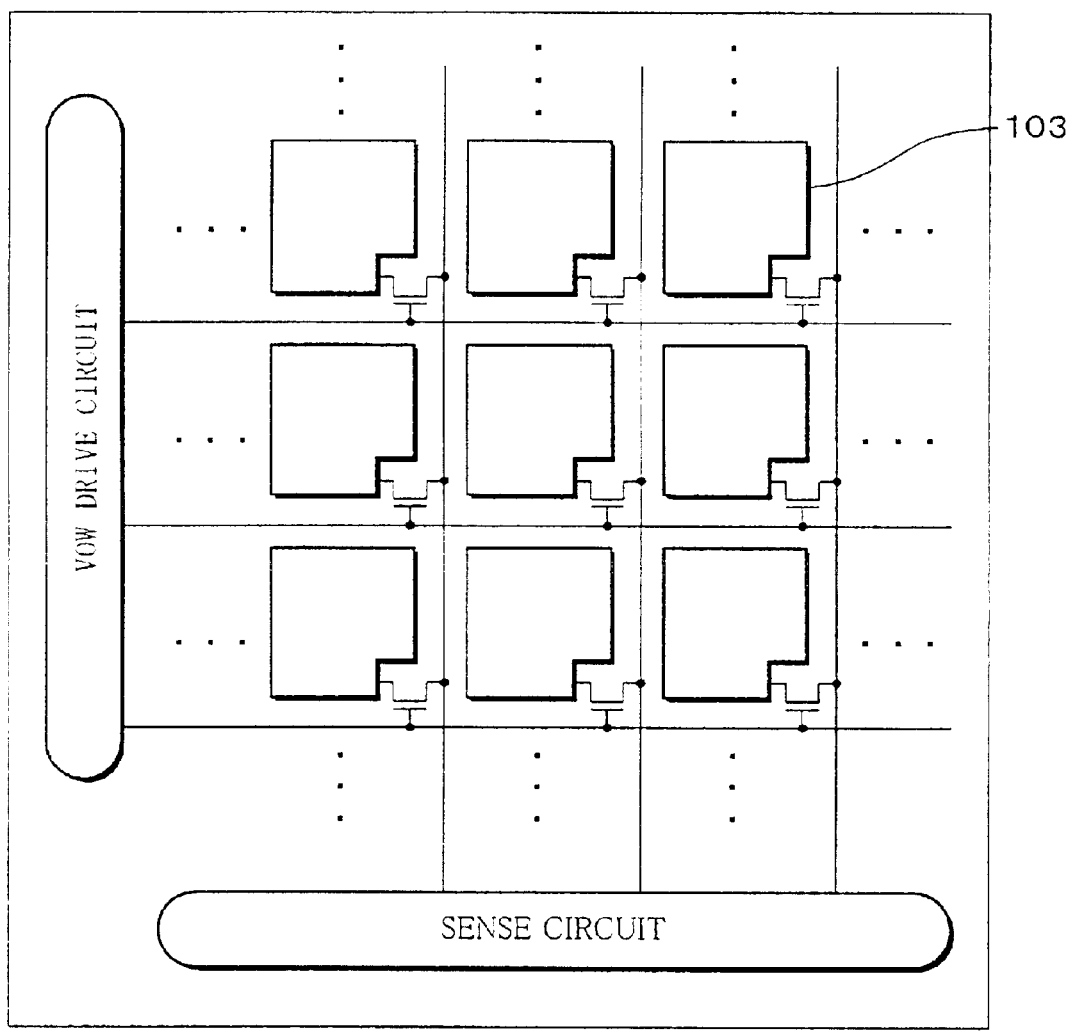
FIG. 13 is a plan showing the main part of the fingerprint sensor illustrated in FIG. 12.

The following description will discuss another embodiment in accordance with the present invention in reference to FIGS. 9 to 11. By the way, members having the same functions as those described in Embodiment 1 are given the same numbers, so that the descriptions are omitted for the sake of convenience.

As in Embodiment 1, an uneven pattern sensing device in accordance with the present embodiment includes, as FIG. 9 shows, the upper layer insulating film 16 formed on the active matrix substrate 15 including the gate electrode 2, the data electrode 3, the gate insulating film 4, the channel layer 5, the contact layer 6, the connecting electrode 7, the insulating protective film 8, the interlayer insulating film 10, and the sense electrode 11. On the active matrix 15, an auxiliary capacity electrode 21 is also provided.

The auxiliary capacity electrode 21, the gate insulating film 4, the connecting electrode 7 and so forth form an auxiliary capacity (capacity) 20.

The gate insulating film 4 is provided so as to cover the gate electrode 2 and the auxiliary capacity electrode 21, and a part of the film 4 above the gate electrode 2 works as a gate insulating film of the TFT9, meanwhile a part of the film 4 above the auxiliary capacity electrode 21 works as a dielectric layer of the auxiliary capacity 20. The connecting electrode 7 is, as illustrated in FIG. 10, provided to connect the TFT9 to the auxiliary capacity 20. In other words the auxiliary capacity 20 is formed in an area where the auxiliary capacity electrode 21 provided in the same layer as the gate electrode 2 and the connecting electrode 7 are overlapped with each other.

The contact hole 12 is provided through an area of the connecting electrode 7 where the connecting electrode 7 faces the auxiliary capacity electrode 21 via the auxiliary capacity 20.

the auxiliary capacity electrode 21 is formed on the insulating substrate 1 by forming a conductive film made of tantalum, aluminum, ITO and so forth having a thickness of 100 to 300 nm by means of sputter deposition and then patterning the same in a desired form. In this manner the auxiliary capacity electrode 21 is formed along with the gate electrode 2. The manufacturing process after this step is identical with that of Embodiment 1.

Now, when:

the auxiliary capacity 20, which is a capacity formed between the sense electrode 11 and the auxiliary capacity electrode 21, is taken as Cxx;

a capacity of the upper layer insulating film 16 is taken as Cy; and a capacity of air between the surface of the finger and the uneven pattern sensing device is taken as Cz, a capacitance value Cout sensed by the data electrode 3 at the moment of examining a fingerprint is expressed in following eq. (5).

$$\text{Cout}=Cxx+CyCz/(Cy+Cz) \quad (5)$$

When the auxiliary capacity electrode 21 is not provided, charge condition of a parasitic capacity Cx formed in the sense electrode 11 and connecting electrode 7 is likely to be susceptible to an electrical potential in the surroundings so as to be unstable. However, providing the auxiliary capacity electrode 21 makes it possible to form the auxiliary capacity 20 which is capable of carrying charge, between the sense electrode 11 and the auxiliary capacity electrode 21. Thus it is possible to keep the auxiliary capacity 20 steady by keeping the auxiliary capacity electrode 21 at a fixed electrical potential. On this account it is possible to steady the operation of sensing a fingerprint.

By the way, when the auxiliary capacity electrode 21 is provided, it is possible to conduct a sensing operation employing a voltage sensing approach as follows.

As FIG. 11 shows, for instance, bias voltage is applied to a space between a human body 22 and the auxiliary capacity electrode 21, to sense a fingerprint. In this case the human body 22 is taken as V (V) and the auxiliary capacity electrode 21 is grounded, and an electrical potential Vout sensed by the data electrode 3 is expressed in following eq. (6).

$$\text{Vout}=VCyCz/(CyCz+Cxx(Cy+Cz)) \quad (6)$$

The potential Vout is maximized when Cz→∞ (the surface of the finger touches the upper layer insulating film 16), and in this case an electrical potential Vout(max) is expressed in following eq. (7).

$$\text{Vout(max)}=VCy/(Cxx+Cy) \quad (7)$$

Meanwhile the potential Vout is minimized when Cz→0 (the surface of the finger is not above the upper layer insulating film 16), and in this case an electrical potential Vout(min) is expressed in following eq. (8).

$$\text{Vout(min)}=0 \quad (8)$$

By sensing the Vout via the data electrode 3, it is possible to obtain a picture of the fingerprint.

Incidentally, there is probability that the auxiliary capacity electrode 21 is taken as V (V) while the human body 22 is grounded, and the bias voltage between the human body 22 and the auxiliary capacity electrode 21 may be applied while periodically reversing the polarity of the voltage. Also high and low frequencies may be applied to the space between the human body 22 and the auxiliary capacity electrode 21.

Although the sense electrode 11 is employed as one of the electrodes forming the auxiliary capacity 20, an electrode having the same electrical potential as the sense electrode 11 may be employed. In this manner it is possible to keep the electrical potential of the auxiliary capacity electrode 21 steady by forming the auxiliary capacity 20 which is capable of carrying charge, and the auxiliary capacity 20 can be kept in a steady state. Thus it is possible to steady the operation of sensing a fingerprint conducted in the fingerprint sensor.

As described above, an uneven pattern sensing device in accordance with the present invention includes:

scanning lines and signal lines formed on a substrate in a grid pattern;

switching elements formed on the substrate in each grid and connected to the scanning lines and the signal lines;

an insulating film, formed on the substrate so as to cover the switching elements, having contact holes each of which is a perforation;

sense electrodes formed on the insulating film and connected to the switching elements via the contact holes; and a protective film formed on the insulating film so as to cover the sense electrode, wherein the insulating film has a flat area, which excludes a surface where each contact hole is provided, on which the sense electrode is provided.

According to this arrangement, the insulating film has a flat area, which excludes a surface where each contact hole is provided, on which the sense electrode is provided. This makes it also possible to form a flat protective film on the insulating film. Thus in the protective film it is unnecessary to conduct smoothing processes such as a process to etchback by applying a resist and a CMP process, so that a choice of materials for the protective film is not limited. Consequently, as the protective film it is possible to adopt a wide variety of functional protective films using materials with added value such as a material having characteristics for improving the sensitivity of the uneven pattern sensing device and a material with pollution resistance.

The uneven pattern sensing device is preferably such that the surface on which the sense electrode is formed is flat when the insulating film is formed.

According to this arrangement, in not only the protective film but also the insulating film, it is unnecesary to conduct the smoothing processes such as the process to etchback by applying a resist and the CMP process. On this account it is possible to simplify the manufacturing process of the uneven pattern sensing device.

The uneven pattern sensing device is preferably such that the insulating film is made of an organic matter.

According to this arrangement, it is possible to form the insulating film by application of an insulating material using a spinner etc., since the insulating film is made of, for instance, an organic matter such as an acrylic resin. This makes it possible to form the insulating film with a flat and difference-free surface. In other words, it is unnecesary to include processes such as a process to etchback by applying a resist and a CMP (Chemical Mechanical Polishing) process for smoothing out the surface difference reflecting the shape of members under the insulating film such as, for instance, the switching elements, the data electrode, and the gate electrode.

Therefore the process to smooth out the protective film is unnecesary even when, for instance, the protective film is formed on the insulating film so as to cover the sense electrode. On this account, the material for the protective film is not limited to materials with which the smoothing process can be conducted. As a result it is possible to smooth out the surface of the uneven pattern sensing device without any increase of the manufacturing process such as the smoothing process and limitation of a choice of materials for the protective film.

The uneven pattern sensing device is preferably such that the insulating film has photosensitivity.

According to this arrangement, it is easy to form an opening (contact hole) penetrating the insulating film through which the sense electrode passes, by a photolithographic treatment.

The uneven pattern sensing device is preferably such that the insulating film has a thickness of not less than 1 μm and not more than 5 μm.

According to this arrangement, by adjusting the thickness of the insulating film not less than 1 μm, which is thicker than the switching elements, the gate electrode and the data electrode, etc. that are provided under the film, it is possible to eliminate the difference on the surface of the insulating film so as to smooth out the surface of the uneven pattern sensing device.

Also, by adjusting the thickness of the insulating film not more than 5 μm, it is possible to form the insulating film uniformly on, for instance, a large substrate having an area around 300 mm×300 mm to 1000 mm×1000 mm. On this account, it is possible to manufacture a lot of the uneven pattern sensing devices from a large substrate without lowering reliability of the devices.

The uneven pattern sensing device is preferably such that the sense electrode is provided so as to be overlapped with at least either one of the scanning lines and the signal lines.

According to this arrangement, the sense electrode in this case can be formed larger than a sense electrode provided not to be overlapped with either the scanning lines nor the signal lines. Thus a fill factor (a ratio of an area of one sensing pixel occupied by the sense electrode) of the sense electrode on the substrate of the uneven pattern sensing device is also increased.

For instance, when the protective film is provided on the insulating film so as to cover the sense electrode, generally the greater a capacitance value of the protective film is, the higher sensitivity of the uneven pattern sensing device is. Also the capacitance value of the protective film which film is provided on the sense electrode is proportional to the size (occupying area) of the sense electrode, and hence the greater the capacitance value of the protective film is, the higher the sensitivity of the uneven pattern sensing device is.

In this manner it is possible to increase the capacitance value of the protective film by increasing the fill factor of the sense electrode, and thus this enables to provide a highly sensitive uneven pattern sensing device.

The uneven pattern sensing device is preferably such that the sense electrode is provided so as to be overlapped with the switching elements.

According to this embodiment, it is possible to increase the fill factor of the sense electrode and provide the highly sensitive uneven pattern sensing device. The sense electrode also acts as an electric shield of the switching elements provided under the sense electrode, and hence it is possible to prevent malfunction of the switching elements.

The uneven pattern sensing device is preferably such that a shade film is provided on the switching elements.

According to this embodiment, it is possible to prevent external light from the top surface of the uneven pattern sensing device from being made incident on the switching elements. Thus it is possible to prevent the malfunction of the switching elements caused by the incident light.

If the shade film is not provided, for instance, in a case when the switching elements employ a reverse stagger structure, an unnecessary carrier is generated in a channel layer at the moment of the incidence of light on the channel layer, and ON/OFF characteristics thereof is degraded. However, providing the shade film on a TFT prevents the degradation of the ON/OFF characteristics.

The uneven pattern sensing device is preferably such that the sense electrode has a shading property.

According to this arrangement, it is possible to reduce an influence of external light for the switching elements and thus it is possible to prevent the malfunction of the switching elements and the degradation of the ON/OFF characteristics thereof. Also it is unnecesary to additionally provide the shade film since the sense electrode has a shading property, so that the structure of the uneven pattern sensing device can be simplified.

The uneven pattern sensing device is preferably such that the insulating film has a shading property.

According to this arrangement, it is possible to reduce an influence of external light for the switching elements by, for instance, dispersing carbon black in the insulating film and imparting a shading property thereto. Thus it is possible to prevent the malfunction of the switching elements and the degradation of the ON/OFF characteristics thereof. Also it is unnecesary to additionally provide the shade film since the insulating film has a shading property, so that the structure of the uneven pattern sensing device can be simplified.

The uneven pattern sensing device preferably includes an auxiliary capacity electrode for forming capacity with the sense electrode.

According to this arrangement, it is possible to form a capacity which is capable of carrying charge, between the sense electrode and the auxiliary capacity electrode. Thus it is possible to keep the capacity steady by keeping the auxiliary capacity electrode at a fixed electrical potential, and in the uneven pattern sensing device, it is possible to steady the operation of sensing uneven patterns.

The uneven pattern sensing device is preferably such that an auxiliary capacity which is formed with either one of the sense electrode and an electrode having a same electrical potential as the sense electrode is provided in a layer under the insulating film.

According to this arrangement, it is possible to form the auxiliary capacity which is capable of carrying charge, between the sense electrode and the auxiliary capacity electrode. Thus in the uneven pattern sensing device, it is possible to steady the operation of sensing uneven patterns.

The uneven pattern sensing device is preferably such that the substrate is an insulating property.

According to this arrangement, it is possible to manufacture a large substrate with ease since the substrate is made of, for instance, ceramic or plastic. On this account it is possible to manufacture a lot of uneven pattern sensing devices from a single large substrate and hence it is possible to provide an inexpensive fingerprint sensor.

Also using a material such as, for instance, plastic makes it possible to fulfil down-sizing and weight-reduction of the substrate. Moreover the substrate made of plastic has good cracking resistance and hence this makes it possible to provide a reliable uneven pattern sensing device.

The uneven pattern sensing device is preferably such that the substrate is a glass substrate made of glass.

According to this arrangement, it is possible to adopt an inexpensive glass substrate as the substrate of the uneven pattern sensing device. Adopting the glass substrate also makes it possible to manufacture a large substrate with ease, and hence it is possible to manufacture a lot of uneven pattern sensing devices from a single large substrate. On this account it is possible to provide an inexpensive uneven pattern sensing device.

The uneven pattern sensing device is preferably such that at least either one of a drive circuit for applying a drive signal to the scanning lines and a sense circuit for sensing a signal from the signal lines is directly mounted on the glass substrate.

According to this arrangement, a COG (Chip On Glass) mounting method in which an LSI is directly mounted on a glass substrate is adopted so that it is possible to simplify the manufacturing process and the connection with surrounding circuits, compared to a TAB (Tape Automated Bonding) mounting method in which a drive circuit LSI or a sense circuit LSI is additionally provided and mounted on a career tape before connected to the substrate.

The uneven pattern sensing device is preferably such that at least either one of a drive circuit for applying a drive signal to the scanning lines and a sense circuit for sensing a signal from the signal lines is monolithically formed on the glass substrate.

According to this arrangement, it is possible to manufacture the drive circuit and sense circuit in the same manufacturing process as that of the switching elements of the uneven pattern sensing device. On this account it is unnecesary to additionally provide the drive circuit LSI and the sense circuit LSI so that cutting the manufacturing cost and simplifying the mounting process can be accomplished.

Moreover, it is possible to provide the drive circuit and sense circuit in a small area of a peripheral part of a sensing pixel arrangement area on the glass substrate. Thus it is possible to provide the glass substrate having a frame narrower than that of the glass substrate to which a drive circuit LSI and a sense circuit LSI are connected by the TAB or COG mounting method, and hence the uneven pattern sensing device can be down-sized.

The uneven pattern sensing device is preferably such that the drive circuit and the sense circuit are made of either one of polysilicon and continuous grain boundary silicon.

According to this arrangement, the drive circuit and sense circuit can be formed on the glass substrate at a low process temperature which is not more than 600° C.

The uneven pattern sensing device is preferably such that the protective film is made up of a dielectric film having a relative permittivity of not less than 5, more specifically the film is made of $SiN_x$.

According to this arrangement, a capacitance value of the protective film can be increased by imparting a high relative permittivity to the film.

The uneven pattern sensing device is preferably such that the protective film is made up of a dielectric film having a relative permittivity of not less than 10, more specifically the protective film includes a matter selected from the group consisting of $Ta_2O_5$, $TiO_2$, $SrTiO_3$, $BaTiO_3$, and $Ba_xSr_{1-x}TiO_3$.

According to this arrangement, a capacitance value of the protective film can be further increased by imparting a higher relative permittivity to the film. Thus it is possible to provide a further sensitive uneven pattern sensing device.

Moreover a material of the protective film can be chosen from wider variations, since it is possible to smooth out the protective film without using an SOG material.

The uneven pattern sensing device is preferably such that the protective film is made up of a fluororesin.

According to this arrangement, it is possible to improve a pollution resistance of the protective film which is the surface of the uneven pattern sensing device, and also reliability of the element can be improved.

The uneven pattern sensing device is preferably such that the protective film is formed by a dry transferring method.

According to this arrangement, it is possible to form a fluororesin as the protective film with ease.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. An uneven pattern sensing device, comprising:

scanning lines and signal lines formed on a substrate in a grid pattern;

switching elements formed on the substrate in each grid and connected to the scanning lines and the signal lines;

an insulating film, formed on the substrate so as to at least partially cover the switching elements, the insulating film having contact holes each of which is a perforation;

sense electrodes formed on the insulating film and connected to the switching elements via the contact holes; and a protective film formed on the insulating film so as to cover the sense electrodes, wherein an entire upper surface of the insulating film is flat except for areas proximate the contact holes.

2. The uneven pattern sensing device as set forth in claim 1, wherein the surface on which the sense electrode is formed is flat when the insulating film is formed.

3. The uneven pattern sensing device as set forth in claim 1, wherein the insulating film is formed by application of an insulating material.

4. The uneven pattern sensing device as set forth in claim 1, wherein the insulating film is made of an organic matter.

5. The uneven pattern sensing device as set forth in claim 4, wherein the insulating film has photosensitivity.

6. The uneven pattern sensing device as set forth in claim 1, wherein the insulating film has thickness of not less than 1 $\mu$m and not more than 5 $\mu$m.

7. The uneven pattern sensing device as set forth in claim 1, wherein the sense electrode is provided so as to be overlapped with at least either one of the scanning lines and the signal lines.

8. The uneven pattern sensing device as set forth in claim 1, wherein the sense electrode is provided so as to be overlapped with the switching elements.

9. The uneven pattern sensing device as set forth in claim 1, wherein a shade film is provided on the switching elements.

10. The uneven pattern sensing device as set forth in claim 1, wherein the sense electrode has a shading property.

11. The uneven pattern sensing device as set forth in claim 1, wherein the insulating film has a shading property.

12. The uneven pattern sensing device as set forth in claim 1, further comprising an auxiliary capacity electrode for forming a capacity with the sense electrode.

13. The uneven pattern sensing device as set forth in claim 1, wherein an auxiliary capacity which is formed with either one of the sense electrode and an electrode having a same electrical potential as the sense electrode is provided in a layer under the insulating film.

14. The uneven pattern sensing device as set forth in claim 1, wherein the substrate is an insulating property.

15. The uneven pattern sensing device as set forth in claim 14, wherein the substrate is a glass substrate made of glass.

16. The uneven pattern sensing device as set forth in claim 14, wherein the substrate is made of plastic.

17. The uneven pattern sensing device as set forth in claim 15, wherein at least either one of a drive circuit for applying a drive signal to the scanning lines and a sense circuit for sensing a signal from the signal lines is directly mounted on the glass substrate.

18. The uneven pattern sensing device as set forth in claim 15, wherein at least either one of a drive circuit for applying a drive signal to the scanning lines and a sense circuit for sensing a signal from the signal lines is monolithically formed on the glass substrate.

19. The uneven pattern sensing device as set forth in claim 18, wherein the drive circuit and the sense circuit are made of either one of polysilicon and continuous grain boundary silicon.

20. The uneven pattern sensing device as set forth in claim 1, wherein the protective film is made up of a dielectric film having a relative permittivity of not less than 5.

21. The uneven pattern sensing device as set forth in claim 20, wherein the protective film comprises silicon nitride.

22. The uneven pattern sensing device as set forth in claim 1, wherein the protective film is made up of a dielectric film having a relative permittivity of not less than 10.

23. The uneven pattern sensing device as set forth a claim 22, wherein the protective film includes a matter selected from the group consisting of $Ta_2O_5$, $TiO_2$, $SrTiO_3$, $BaTiO_3$, and $Ba_xSr_{1-x}TiO_3$.

24. The uneven pattern sensing device as set forth in claim 1, wherein the protective film comprises a fluororesin.

25. The uneven pattern sensing device as set forth in claim 24, wherein the protective film is formed by a dry transferring method.

26. The device of claim 1, wherein, except for areas at the contact holes, the upper surface of the insulating film is characterized by differences in level no greater than 0.5 $\mu$m.

* * * * *